(12) United States Patent
Jayabharathi (10) Patent No.: US 7,240,267 B2
(45) Date of Patent: Jul. 3, 2007

(54) SYSTEM AND METHOD FOR CONDUCTING BIST OPERATIONS

(75) Inventor: Dinesh Jayabharathi, Orange, CA (US)

(73) Assignee: Marvell International Ltd., Hamilton (BM)

(*) Notice: Subject to any disclaimer, the term of this patent is extended or adjusted under 35 U.S.C. 154(b) by 165 days.

(21) Appl. No.: 10/983,944

(22) Filed: Nov. 8, 2004

(65) Prior Publication Data

US 2006/0117235 A1    Jun. 1, 2006

(51) Int. Cl.
*G01R 31/28* (2006.01)

(52) U.S. Cl. .................................... 714/733

(58) Field of Classification Search ............. None
See application file for complete search history.

(56) References Cited

U.S. PATENT DOCUMENTS

| | | |
|---|---|---|
| 3,800,281 A | 3/1974 | Devore et al. |
| 3,988,716 A | 10/1976 | Fletcher et al. |
| 4,001,883 A | 1/1977 | Strout et al. |
| 4,016,368 A | 4/1977 | Apple, Jr. |
| 4,050,097 A | 9/1977 | Miu et al. |
| 4,080,649 A | 3/1978 | Calle et al. |
| 4,156,867 A | 5/1979 | Bench et al. |
| 4,225,960 A | 9/1980 | Masters |
| 4,275,457 A | 6/1981 | Leighou et al. |
| 4,390,969 A | 6/1983 | Hayes |
| 4,451,898 A | 5/1984 | Palermo et al. |
| 4,486,750 A | 12/1984 | Aoki |
| 4,500,926 A | 2/1985 | Yoshimaru et al. |
| 4,587,609 A | 5/1986 | Boudreau et al. |
| 4,603,382 A | 7/1986 | Cole |
| 4,625,321 A | 11/1986 | Pechar et al. |
| 4,667,286 A | 5/1987 | Young et al. |
| 4,777,635 A | 10/1988 | Glover |
| 4,805,046 A | 2/1989 | Kuroki et al. |
| 4,807,116 A | 2/1989 | Katzman et al. |
| 4,807,253 A | 2/1989 | Hagenauer et al. |
| 4,809,091 A | 2/1989 | Miyazawa et al. |
| 4,811,282 A | 3/1989 | Masina |

(Continued)

FOREIGN PATENT DOCUMENTS

EP    0528273    2/1993

(Continued)

OTHER PUBLICATIONS

PCT International Search Report, Doc. No. PCT/US00/15084, Dated Nov. 15, 2000, 2 Pages.

(Continued)

*Primary Examiner*—Christine T. Tu (57) ABSTRACT

Method and system for initiating a built in self test ("BIST") operation for memory modules is provided. The method includes, determining if a test access port ("TAP") controller instruction or an internal register control bit are to be used for initiating the BIST operation; sending the internal register control bit to a memory BIST controller for initiating the BIST operation; and setting a status bit in the internal register after the BIST operation is complete. The system includes a storage controller with an internal register for setting a control bit for initiating a BIST operation; a test access port ("TAP") controller for sending an instruction to a memory BIST controller to initiate a BIST operation; and a multiplexer for selecting between the control bit and the instruction for initiating the BIST operation.

15 Claims, 4 Drawing Sheets

U.S. PATENT DOCUMENTS

| | | |
|---|---|---|
| 4,812,769 A | 3/1989 | Agoston |
| 4,860,333 A | 8/1989 | Bitzinger et al. |
| 4,866,606 A | 9/1989 | Kopetz |
| 4,881,232 A | 11/1989 | Sako et al. |
| 4,920,535 A | 4/1990 | Watanabe et al. |
| 4,949,342 A | 8/1990 | Shimbo et al. |
| 4,970,418 A | 11/1990 | Masterson |
| 4,972,417 A | 11/1990 | Sako et al. |
| 4,975,915 A | 12/1990 | Sako et al. |
| 4,989,190 A | 1/1991 | Kuroe et al. |
| 5,014,186 A | 5/1991 | Chisholm |
| 5,023,612 A | 6/1991 | Liu |
| 5,027,357 A | 6/1991 | Yu et al. |
| 5,050,013 A | 9/1991 | Holsinger |
| 5,051,998 A | 9/1991 | Murai et al. |
| 5,068,755 A | 11/1991 | Hamilton et al. |
| 5,068,857 A | 11/1991 | Yoshida |
| 5,072,420 A | 12/1991 | Conley et al. |
| 5,088,093 A | 2/1992 | Storch et al. |
| 5,109,500 A | 4/1992 | Iseki et al. |
| 5,117,442 A | 5/1992 | Hall |
| 5,127,098 A | 6/1992 | Rosenthal et al. |
| 5,133,062 A | 7/1992 | Joshi et al. |
| 5,136,592 A | 8/1992 | Weng |
| 5,146,585 A | 9/1992 | Smith, III |
| 5,157,669 A | 10/1992 | Yu et al. |
| 5,162,954 A | 11/1992 | Miller et al. |
| 5,193,197 A | 3/1993 | Thacker |
| 5,204,859 A | 4/1993 | Paesler et al. |
| 5,218,564 A | 6/1993 | Haines et al. |
| 5,220,569 A | 6/1993 | Hartness |
| 5,237,593 A | 8/1993 | Fisher et al. |
| 5,243,471 A | 9/1993 | Shinn |
| 5,249,271 A | 9/1993 | Hopkinson |
| 5,257,143 A | 10/1993 | Zangenehpour |
| 5,261,081 A | 11/1993 | White et al. |
| 5,271,018 A | 12/1993 | Chan |
| 5,274,509 A | 12/1993 | Buch |
| 5,276,564 A | 1/1994 | Hessing et al. |
| 5,276,662 A | 1/1994 | Shaver, Jr. et al. |
| 5,276,807 A | 1/1994 | Kodama et al. |
| 5,280,488 A | 1/1994 | Glover et al. |
| 5,285,327 A | 2/1994 | Hetzler |
| 5,285,451 A | 2/1994 | Henson et al. |
| 5,301,333 A | 4/1994 | Lee |
| 5,307,216 A | 4/1994 | Cook et al. |
| 5,315,708 A | 5/1994 | Eidler et al. |
| 5,339,443 A | 8/1994 | Lockwood |
| 5,361,266 A | 11/1994 | Kodama et al. |
| 5,361,267 A | 11/1994 | Godiwala et al. |
| 5,408,644 A | 4/1995 | Schneider et al. |
| 5,420,984 A | 5/1995 | Good et al. |
| 5,428,627 A | 6/1995 | Gupta |
| 5,440,751 A | 8/1995 | Santeler et al. |
| 5,465,343 A | 11/1995 | Henson et al. |
| 5,487,170 A | 1/1996 | Bass et al. |
| 5,488,688 A | 1/1996 | Gonzales et al. |
| 5,491,701 A | 2/1996 | Zook |
| 5,500,848 A | 3/1996 | Best et al. |
| 5,506,989 A | 4/1996 | Boldt et al. |
| 5,507,005 A | 4/1996 | Kojima et al. |
| 5,519,837 A | 5/1996 | Tran |
| 5,523,903 A | 6/1996 | Hetzler et al. |
| 5,544,180 A | 8/1996 | Gupta |
| 5,544,346 A | 8/1996 | Amini |
| 5,546,545 A | 8/1996 | Rich |
| 5,546,548 A | 8/1996 | Chen et al. |
| 5,563,896 A | 10/1996 | Nakaguchi |
| 5,568,437 A * | 10/1996 | Jamal ........................ 365/201 |
| 5,572,148 A | 11/1996 | Lytle et al. |
| 5,574,867 A | 11/1996 | Khaira |
| 5,581,715 A | 12/1996 | Verinsky et al. |
| 5,583,999 A | 12/1996 | Sato et al. |
| 5,592,404 A | 1/1997 | Zook |
| 5,600,662 A | 2/1997 | Zook et al. |
| 5,602,857 A | 2/1997 | Zook et al. |
| 5,615,190 A | 3/1997 | Best et al. |
| 5,623,672 A | 4/1997 | Popat |
| 5,626,949 A | 5/1997 | Blauer |
| 5,627,695 A | 5/1997 | Prins et al. |
| 5,640,602 A | 6/1997 | Takase |
| 5,649,230 A | 7/1997 | Lentz |
| 5,664,121 A | 9/1997 | Cerauskis |
| 5,689,656 A | 11/1997 | Baden et al. |
| 5,691,994 A | 11/1997 | Acosta et al. |
| 5,692,135 A | 11/1997 | Alvarez, II et al. |
| 5,692,165 A | 11/1997 | Jeddeloh et al. |
| 5,719,516 A | 2/1998 | Sharpe-Geisler |
| 5,729,718 A | 3/1998 | Au |
| 5,740,466 A | 4/1998 | Geldman |
| 5,745,793 A | 4/1998 | Atsatt et al. |
| 5,754,759 A | 5/1998 | Clarke et al. |
| 5,758,188 A | 5/1998 | Appelbaum et al. |
| 5,784,569 A | 7/1998 | Miller et al. |
| 5,794,073 A | 8/1998 | Ramakrishnan et al. |
| 5,801,998 A | 9/1998 | Choi |
| 5,818,886 A | 10/1998 | Castle |
| 5,822,142 A | 10/1998 | Hicken |
| 5,831,922 A | 11/1998 | Choi |
| 5,835,930 A | 11/1998 | Dobbek |
| 5,841,722 A | 11/1998 | Willenz |
| 5,844,844 A | 12/1998 | Bauer et al. |
| 5,850,422 A | 12/1998 | Chen |
| 5,854,918 A | 12/1998 | Baxter |
| 5,890,207 A | 3/1999 | Sne et al. |
| 5,890,210 A | 3/1999 | Ishii et al. |
| 5,907,717 A | 5/1999 | Ellis |
| 5,912,906 A | 6/1999 | Wu et al. |
| 5,925,135 A | 7/1999 | Trieu et al. |
| 5,937,435 A | 8/1999 | Dobbek et al. |
| 5,950,223 A | 9/1999 | Chiang et al. |
| 5,968,180 A | 10/1999 | Baco |
| 5,983,293 A | 11/1999 | Murakami |
| 5,991,911 A | 11/1999 | Zook |
| 6,029,226 A | 2/2000 | Ellis et al. |
| 6,029,250 A | 2/2000 | Keeth |
| 6,041,417 A | 3/2000 | Hammond et al. |
| 6,065,053 A | 5/2000 | Nouri et al. |
| 6,067,206 A | 5/2000 | Hull et al. |
| 6,070,200 A | 5/2000 | Gates et al. |
| 6,078,447 A | 6/2000 | Sim |
| 6,081,849 A | 6/2000 | Born et al. |
| 6,092,231 A | 7/2000 | Sze |
| 6,094,320 A | 7/2000 | Ahn |
| 6,124,994 A | 9/2000 | Malone, Sr. |
| 6,134,063 A | 10/2000 | Weston-Lewis et al. |
| 6,157,984 A | 12/2000 | Fisher |
| 6,178,486 B1 | 1/2001 | Gill et al. |
| 6,192,499 B1 | 2/2001 | Yang |
| 6,201,655 B1 | 3/2001 | Watanabe et al. |
| 6,223,303 B1 | 4/2001 | Billings et al. |
| 6,279,089 B1 | 8/2001 | Schibilla et al. |
| 6,297,926 B1 | 10/2001 | Ahn |
| 6,330,626 B1 | 12/2001 | Dennin et al. |
| 6,381,659 B2 | 4/2002 | Proch et al. |
| 6,401,149 B1 | 6/2002 | Dennin et al. |
| 6,470,461 B1 | 10/2002 | Pinvidic et al. |
| 6,487,631 B2 | 11/2002 | Dickinson et al. |
| 6,490,635 B1 | 12/2002 | Holmes |
| 6,530,000 B1 | 3/2003 | Krantz et al. |
| 6,574,676 B1 | 6/2003 | Megiddo |

| | | | |
|---|---|---|---|
| 6,662,334 | B1 | 12/2003 | Stenfort |
| 6,826,650 | B1 | 11/2004 | Krantz et al. |
| 7,062,689 | B2 * | 6/2006 | Slobodnik .................. 714/718 |
| 2001/0044873 | A1 | 11/2001 | Wilson et al. |
| 2003/0037225 | A1 | 2/2003 | Deng et al. |
| 2005/0257109 | A1 * | 11/2005 | Averbuj et al. ............. 714/733 |

FOREIGN PATENT DOCUMENTS

| | | |
|---|---|---|
| EP | 0622726 | 11/1994 |
| EP | 0718827 | 6/1996 |
| GB | 2285166 | 6/1995 |
| JP | 63-292462 | 11/1988 |
| JP | 01-315071 | 12/1989 |
| JP | 03183067 | 8/1991 |
| WO | 98/14861 | 4/1998 |

OTHER PUBLICATIONS

Blathut R. Digital Transmission of Information (Dec. 4, 1990), pp. 429-430.

Hwang, Kai and Briggs, Faye A., "Computer Architecture and Parallel Processing" pp. 156-164.

Zeidman, Bob, "Interleaving DRAMS for faster access", System Design ASIC & EDA, pp. 24-34 (Nov. 1993).

P.M. Bland et. al. Shared Storage Bus Circuitry, IBM Technical Disclosure Bulletin, vol. 25, No. 4, Sep. 1982, pp. 2223-2224.

PCT search report for PCT/US00/07780 mailed Aug. 2, 2000, 4 Pages.

PCT Search Report for PCT/US01/22404, mailed Jan. 29, 2003, 4 Pages.

* cited by examiner

SYSTEM AND METHOD FOR CONDUCTING BIST OPERATIONS

BACKGROUND OF THE INVENTION

1. Field of the Invention

The present invention relates to integrated circuits, and more particularly, to conducting built in self-test "BIST" operations for memory modules.

2. Background

Conventional computer systems typically include several functional components. These components may include a central processing unit (CPU), main memory, input/output ("I/O") devices, and storage devices (for example, tape drives, disk drives; referred to herein as a "storage device").

In conventional systems, the main memory is coupled to the CPU via a system bus or a local memory bus. The main memory is used to provide the CPU access to data and/or program information that is stored in main memory at execution time. Typically, the main memory is composed of random access memory (RAM) circuits. A computer system with the CPU and main memory is often referred to as a host system.

The storage device is coupled to the host system via a storage device controller that handles complex details of interfacing the storage device(s) to the host system. Communications between the host system and the controller is usually provided using one of a variety of standard input/output ("I/O") bus interfaces.

Storage controllers are coupled using various standards, for example, the fibre channel standard incorporated herein by reference in its entirety.

Storage controllers use various processors and memory units (or modules) for storing data/program instructions. For efficient and reliable transfer of data it is important to perform a BIST operation for memory units. Typically, a memory BIST controller is used to perform the BIST. A test access port ("TAP") controller described below may be used to initiate the memory BIST controller itself.

An industry standard, IEEE 11491.1 and 11491A (referred to as the JTAG standard) is often used for testing integrated circuits after assembly onto a printed circuit board. The JTAG standard is incorporated herein by reference in its entirety. Testing is performed using pins/interface associated with a test access port.

Testing of memory modules within a storage controller becomes a problem when the storage controller is mounted on a dense printed circuit board and there may not be enough room for a TAP interface. Even if there is room for a TAP interface, adding a TAP interface increases the overall board cost.

This problem is further magnified, when the storage controller is placed inside a rack or an enclosed environment. In this case getting access to the TAP interface is difficult without altering or tampering the enclosed environment.

Therefore, there is a need for a method and system for efficiently performing BIST for memory units in a storage controller or other similar environments.

SUMMARY OF THE INVENTION

In one aspect of the present invention, a method for initiating a built in self test ("BIST") operation for memory modules is provided. The method includes, determining if a test access port ("TAP") controller instruction or an internal register control bit are to be used for initiating the BIST operation; sending the internal register control bit to a memory BIST controller for initiating the BIST operation; and setting a status bit in the internal register after the BIST operation is complete.

The method also includes sending the TAP instruction to the memory BIST controller; and providing access to a BIST operation result via a TAP interface. The internal register is also used to set a bit that selects between the TAP instruction and the internal register control bit for initiating the BIST operation.

In yet another aspect of the present invention, a system for initiating a BIST operation for memory modules is provided. The system includes, an internal register for setting a control bit for initiating a BIST operation; a TAP controller for sending an instruction to a memory BIST controller to initiate a BIST operation; and a multiplexer for selecting between the control bit and the instruction for initiating the BIST operation.

If the control bit is used to initiate the BIST operation then a status bit is set in the internal register notifying a processor that the BIST operation is complete; and if the instruction is used to initiate the BIST operation, then a test result is accessible via a TAP interface.

In yet another aspect of the present invention, a storage controller for initiating a BIST operation for memory modules is provided. The storage controller includes an internal register for setting a control bit for initiating a BIST operation; a TAP controller for sending an instruction to a memory BIST controller to initiate a BIST operation; and a multiplexer for selecting between the control bit and the instruction for initiating the BIST operation.

This brief summary has been provided so that the nature of the invention may be understood quickly. A more complete understanding of the invention can be obtained by reference to the following detailed description of the preferred embodiments thereof in connection with the attached drawings.

BRIEF DESCRIPTION OF THE DRAWINGS

The foregoing features and other features of the present invention will now be described with reference to the drawings of a preferred embodiment. In the drawings, the same components have the same reference numerals. The illustrated embodiment is intended to illustrate, but not to limit the invention. The drawings include the following Figures.

DETAILED DESCRIPTION OF THE PREFERRED EMBODIMENTS

To facilitate an understanding of the preferred embodiment, the general architecture and operation of a controller will initially be described. The specific architecture and operation of the preferred embodiment will then be described with reference to the general architecture.

Figure 1A:
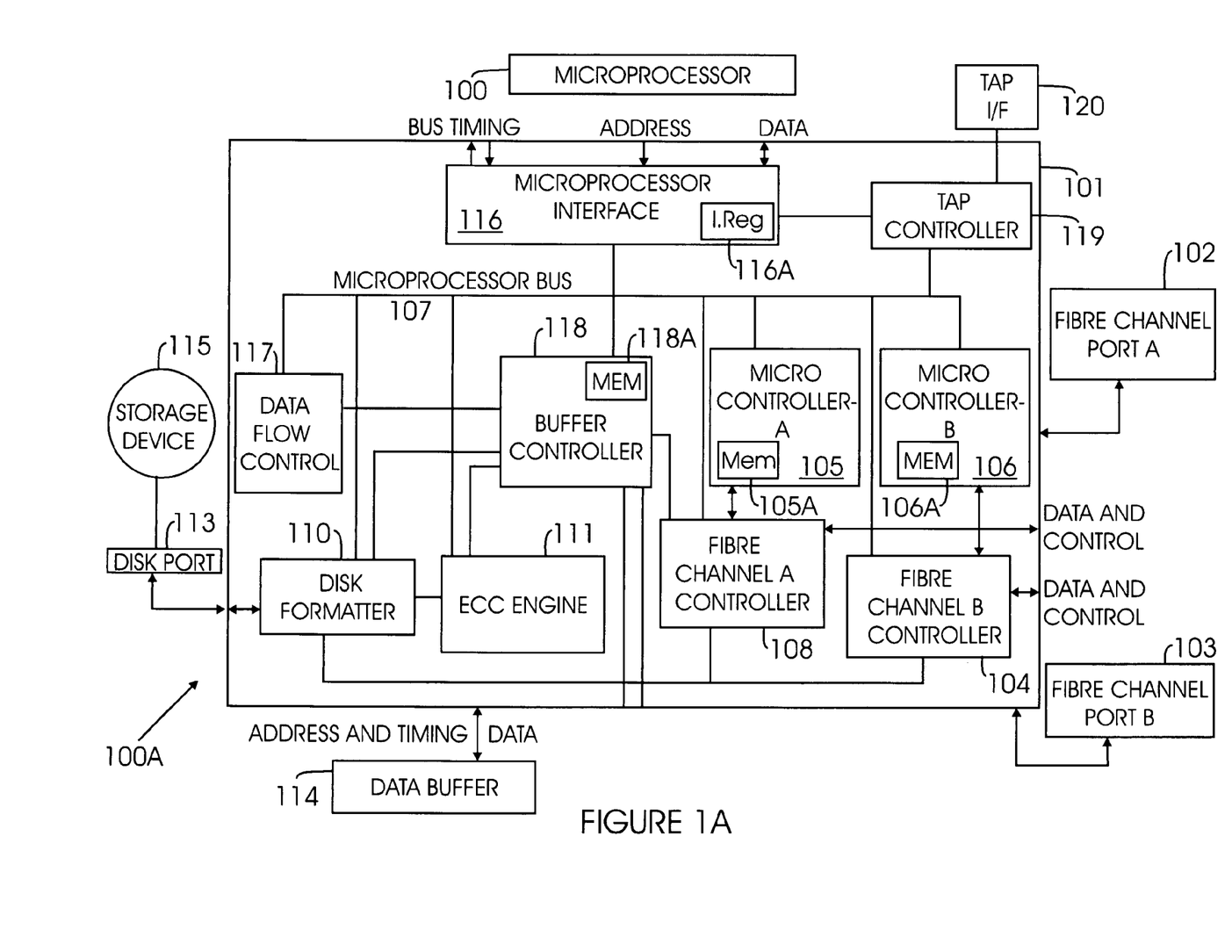
FIG. 1A is a block diagram of a controller, used according to one aspect of the present invention.

System 100A of FIG. 1A is an example of a storage system controller, included (or coupled to) in a computer system. The host computer (not shown) and a storage device 115 communicate via port 113. In an alternate embodiment (not shown), the storage device 115 is an external storage device, which is connected to the host computer via a data bus. Those skilled in the art will appreciate that various communication buses known in the art can be used to transfer data between the drive and the host system.

As shown in FIG. 1A, the system includes controller 101, which is coupled to fibre channel ports 102 and 103, buffer memory 114 and microprocessor 100. Interface 116 serves to couple microprocessor bus 107 to microprocessor 100. A read only memory ("ROM") omitted from the drawing is used to store firmware code executed by microprocessor 100.

Controller 101 can be an integrated circuit (IC) that comprises of various functional modules, which provide for the writing and reading of data stored on storage device 115 or to other devices through fibre channel ports 102 and 103.

Microprocessor 100 is coupled to controller 101 via interface 116 to facilitate transfer of data, address, timing and control information. Buffer memory 114 is coupled to controller 101 via ports to facilitate transfer of data, timing and address information.

Data flow controller 117 is connected to microprocessor bus 107 and to buffer controller 118. Disk formatter 110 formats data that is flowing through system 100A, either from storage device 115 or from fibre channel ports 102/103.

Fibre channel controllers ("A") 104 and ("B") 108 include programmable registers and state machine sequencers that interface with ports 102 and 103. The fibre channel controllers 104 and 108 provide fibre channel control for ports 102 and 103.

Microcontrollers ("A") 105 and ("B") 106 allow customization of fibre channel sequences and control Fibre channel controllers 104 and 108 through a microcontroller interface module (not shown). ECC engine 111 provides error correction for system 100A.

Various memory modules exists in controller 101, for example, memory 105A, 106A and 118A.

TAP controller 119, described in more detail below, is used to control the BIST operation for various memory modules. Information from TAP controller 119 maybe sent via TAP interface ("TAP I/F") 120 and accessed outside system 100A. As discussed above, in some systems TAP I/F 120 may not be available and hence it becomes difficult to perform the BIST tests.

Figure 1B:
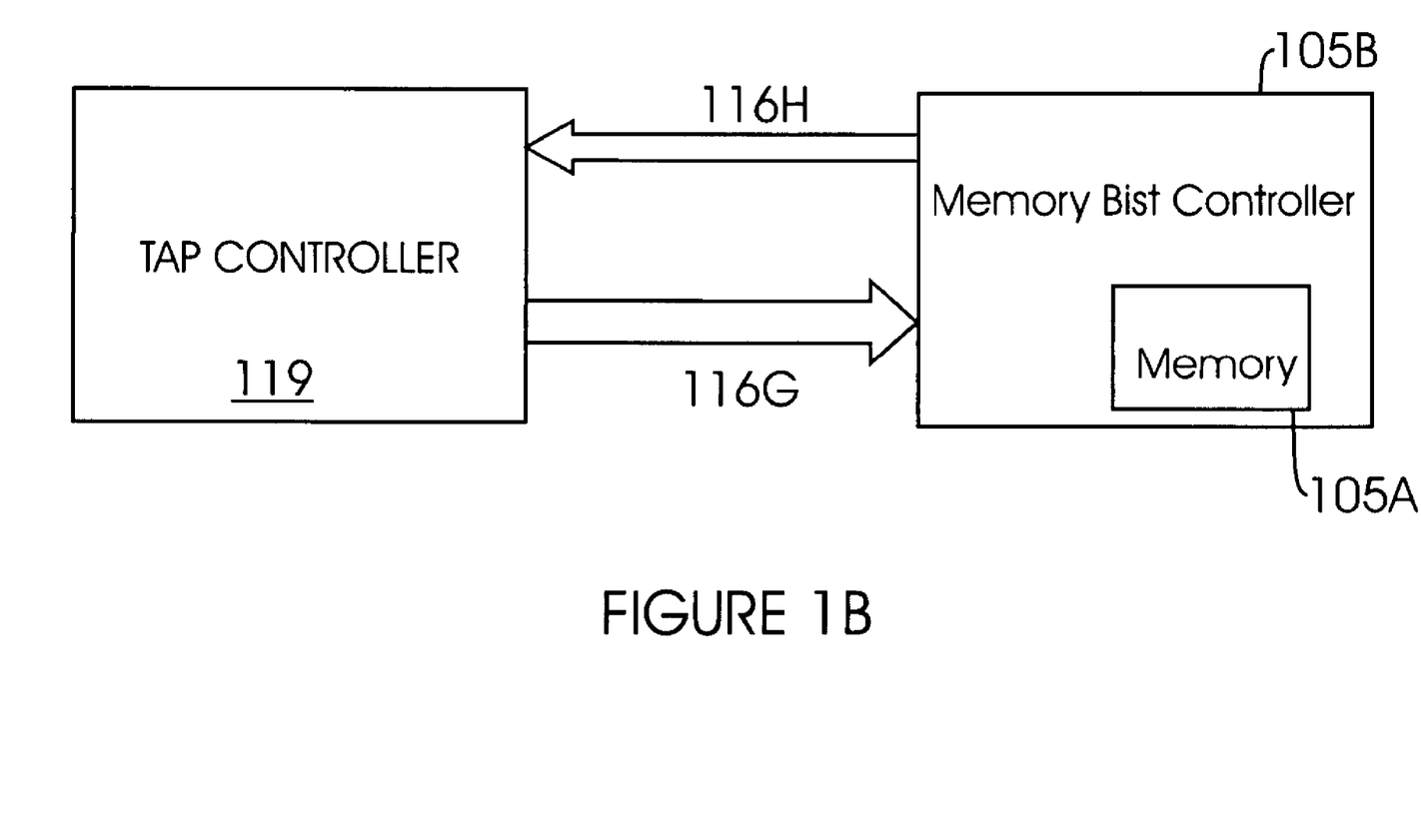
FIG. 1B shows a block diagram where a TAP controller controls the BIST operation.
Figure 2:
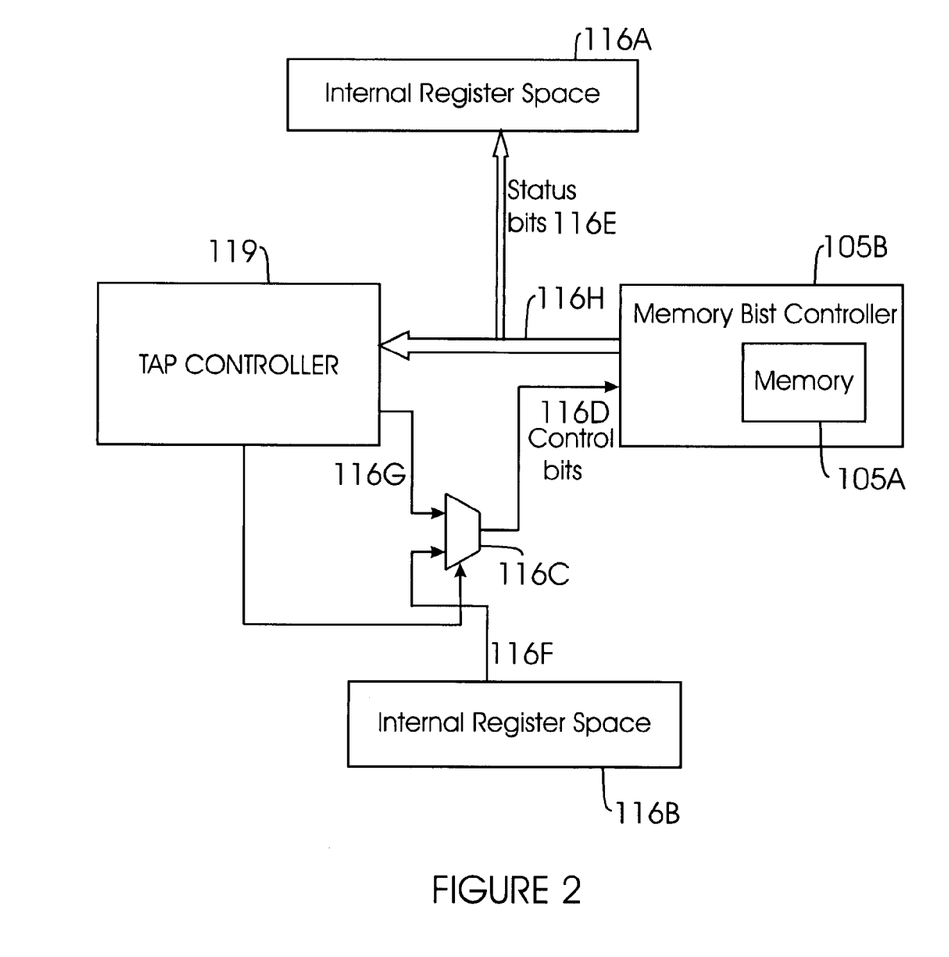
FIG. 2 shows a dual mode BIST control block diagram, according to one aspect of the present invention.

The adaptive aspects of the present invention, allow storage controller 101 to perform the BIST in dual modes. In a first mode, as shown in FIG. 1B, if the TAP I/F 120 is present and detected by controller 101, the BIST may be performed so that BIST results are accessible via TAP I/F 120. In another mode, as shown in FIG. 2, internal register bits are used to initiate the BIST operation and the results are accessible to processor 100 via register reads. The modes may be programmed by firmware using an internal configuration register 116A.

FIG. 1B shows tap controller 119 coupled to a memory controller 105B that controls the BIST operation for memory 105A. Instructions 116G from TAP controller 119 are sent to memory BIST controller 105B and after the test is performed, the results 116H are sent to TAP controller 119. The results 116H may be accessed by a system external to storage controller 101 via TAP I/F 120.

FIG. 2 shows a block diagram where the BIST operation is initiated by using internal register commands. Internal register 116B includes control bits that are used to trigger a BIST operation. Processor 100 may set the control bits. Control bits 116F (also shown as 116D) are sent to BIST controller 105B via a multiplexer ("Mux") 116C. Mux 116C also receives instructions 116G from TAP controller 119. Instructions 116G may be selected to initiate a BIST operation (as shown in FIG. 1B) based on firmware programming.

Memory BIST controller 105B starts and controls the BIST operation for memory 105A. The results 116H are sent to register 116A with status bits 116E. The status bits 116E may be used to generate an interrupt for processor 100. This notifies processor 100 that BIST results are available. Results 116H may also be made available via TAP interface 120.

It is noteworthy that although FIG. 2 shows two registers 116A and 116B, only a single register may be used to initiate the BIST operation described above with respect to FIG. 2 and below with respect to FIG. 3.

Figure 3:
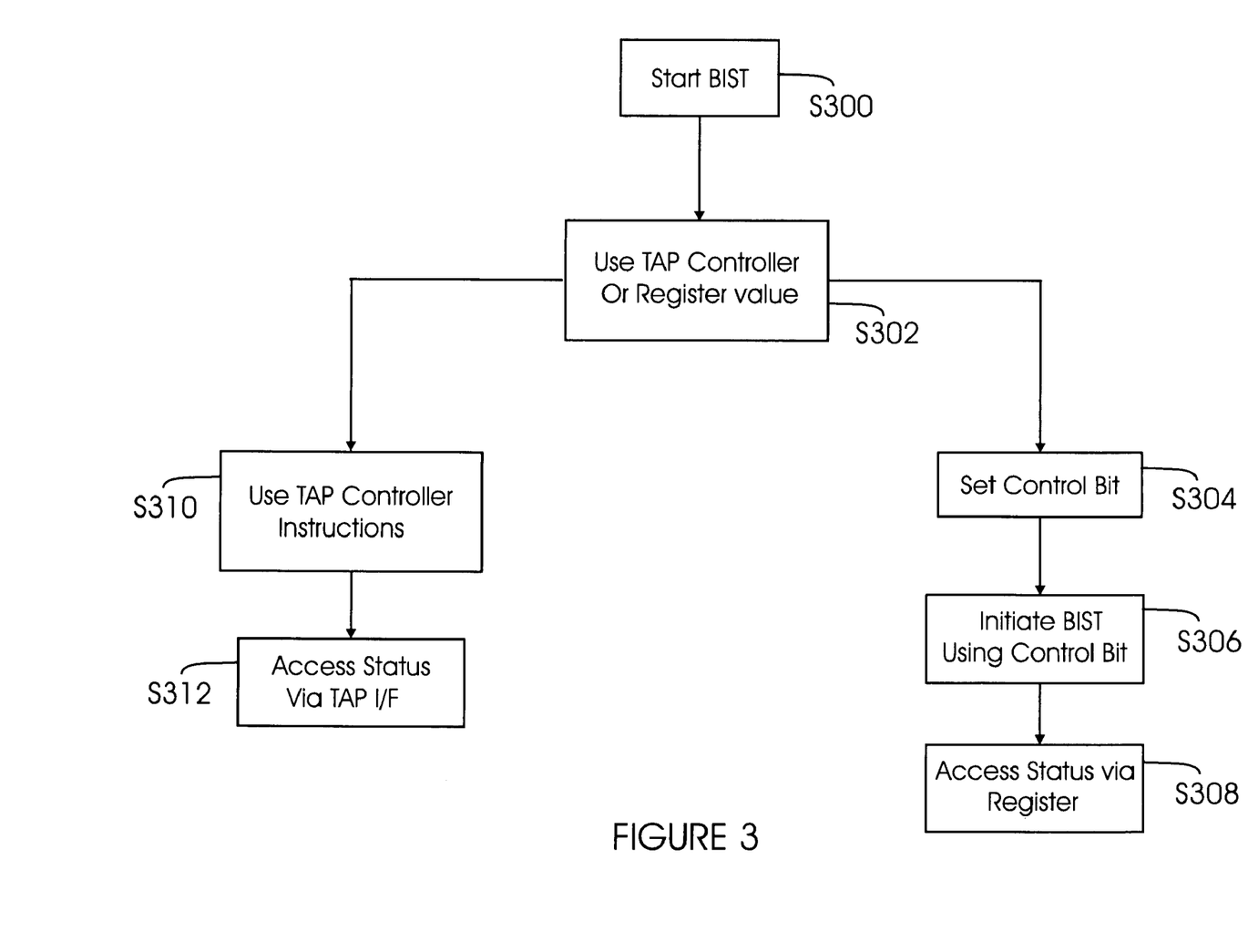
FIG. 3 shows a process flow diagram for conducting a BIST, according to one aspect of the present invention.

FIG. 3 shows a process flow diagram for conducting a BIST operation, according to one aspect of the present invention. Turning in detail to FIG. 3, in step S300, the BIST process is started. In step S302, the process determines whether to use the TAP controller 119 (as shown in FIG. 1B) or an internal register value, as shown in FIG. 2, to initiate the BIST operation.

If the TAP controller 119 is used, then in step S310, standard TAP controller 119 instructions (116G) are used to initiate the BIST operation. The test results may be accessed in step S312 using TAP interface 120.

If register control bits are used (step S302), then in step S304, control bits are set in internal register 116B. In step S306, control bits 116F are used to activate memory BIST controller 105B (shown as 116D via Mux 116C). In step S308, after the test is completed status bits 116E are set in register 116A so that processor 100 may be notified of test completion and provide access to the test results.

In one aspect of the present invention, a user can use the internal register technique to initiate a BIST operation and hence no TAP Interface 120 is required. In another aspect of the present invention, a user has the flexibility of initiating a BIST operation either by using TAP controller instructions or internal register control bits.

Although the present invention has been described with reference to specific embodiments, these embodiments are illustrative only and not limiting. Many other applications and embodiments of the present invention will be apparent in light of this disclosure.

What is claimed is:

1. A method for initiating a built in self test ("BIST") operation for memory modules, comprising of:
   determining whether a test access port ("TAP") controller instruction or an internal register control bit of an internal register is to be used for initiating the BIST operation;
   sending the internal register control bit to a memory BIST controller for initiating the BIST operation; and
   setting a status bit in the internal register after the BIST operation is complete.

2. The method of claim 1, further comprising:
   sending the TAP instruction to the memory BIST controller; and
   providing access to a BIST operation result via a TAP interface.

3. The method of claim 1, wherein the internal register is also used to set a bit that selects between the TAP instruction and the internal register control bit for initiating the BIST operation.

4. The method of claim 1, wherein a processor is used to read the status bit from the internal register and access a BIST operation test result.

5. The method of claim 1, wherein a multiplexer is used to select between the TAP controller instruction and the internal register control bit.

6. A system for initiating a built in self test ("BIST") operation for memory modules, comprising of:
   an internal register for setting a control bit for initiating a BIST operation;
   a test access port ("TAP") controller for sending an instruction to a memory BIST controller to initiate a BIST operation; and
   a multiplexer for selecting between the control bit and the instruction for initiating the BIST operation.

7. The system of claim 6, wherein if the control bit is used to initiate the BIST operation then a status bit is set in the internal register notifying a processor that the BIST operation is complete.

8. The system of claim 6, wherein if the instruction is used to initiate the BIST operation, then a test result is accessible via a TAP interface.

9. The system of claim 6, wherein a bit is set in the internal register for selecting between the control bit and the instruction.

10. The system of claim 9, wherein a processor sets the bit.

11. A storage controller for initiating a built in self test ("BIST") operation for memory modules, comprising of:
   an internal register for setting a control bit for initiating a BIST operation;
   a test access port ("TAP") controller for sending an instruction to initiate a BIST operation to a memory BIST controller; and
   a multiplexer for selecting between the control bit and the instruction for initiating the BIST operation.

12. The storage controller of claim 11, wherein if the control bit is used to initiate the BIST operation then a status bit is set in the internal register notifying a processor that the BIST operation is complete.

13. The storage controller of claim 11, wherein if the instruction is used to initiate the BIST operation, then a test is accessible via a TAP interface.

14. The storage controller of claim 11, wherein a bit is set in the internal register for selecting between the control bit and the instruction.

15. The storage controller of claim 14, wherein a processor sets the bit.

* * * * *

UNITED STATES PATENT AND TRADEMARK OFFICE
CERTIFICATE OF CORRECTION

| | | |
|---|---|---|
| PATENT NO. | : 7,240,267 B2 | Page 1 of 1 |
| APPLICATION NO. | : 10/983944 | |
| DATED | : July 3, 2007 | |
| INVENTOR(S) | : Dinesh Jayabharathi | |

It is certified that error appears in the above-identified patent and that said Letters Patent is hereby corrected as shown below:

Column 6, Line 15        Insert -- result -- after "test"

Signed and Sealed this

Twenty-seventh Day of November, 2007

JON W. DUDAS
*Director of the United States Patent and Trademark Office*